United States Patent [19]

Pernyeszi

[11] 4,453,134
[45] Jun. 5, 1984

[54] HIGH VOLTAGE OPERATIONAL AMPLIFIER

[75] Inventor: Joseph Pernyeszi, Fairfield, Conn.

[73] Assignee: International Telephone and Telegraph Corporation, New York, N.Y.

[21] Appl. No.: 400,199

[22] Filed: Jul. 20, 1982

Related U.S. Application Data

[63] Continuation-in-part of Ser. No. 295,433, Aug. 24, 1981, abandoned.

[51] Int. Cl.³ .......................... H03F 3/45; H03F 3/26
[52] U.S. Cl. ..................................... 330/255; 330/257; 330/275; 330/252
[58] Field of Search ............... 330/257, 252, 288, 307, 330/255, 262, 263, 275; 323/315, 316

[56] References Cited

U.S. PATENT DOCUMENTS 3,801,923  4/1974  Russell et al. ........................ 330/255
4,163,908  8/1979  Price ................................... 330/255

Primary Examiner—James B. Mullins
Assistant Examiner—Gene Wan
Attorney, Agent, or Firm—John T. O'Halloran; Jeffery P. Morris

[57] ABSTRACT

An operational amplifier is disclosed which is capable of handling input voltages in excess of 200 volts, comprising at least in the input stage thereof a plurality of low voltage transistors including at least a pair of low voltage lateral PNP transistors each having two collectors. These lateral PNP transistors act as level shifters for the amplifier and also a bias arrangement for the input stage. A single high voltage lateral PNP is in the signal path providing the lowest pole in the transfer function and to compensate for low to medium loop gains.

4 Claims, 2 Drawing Figures

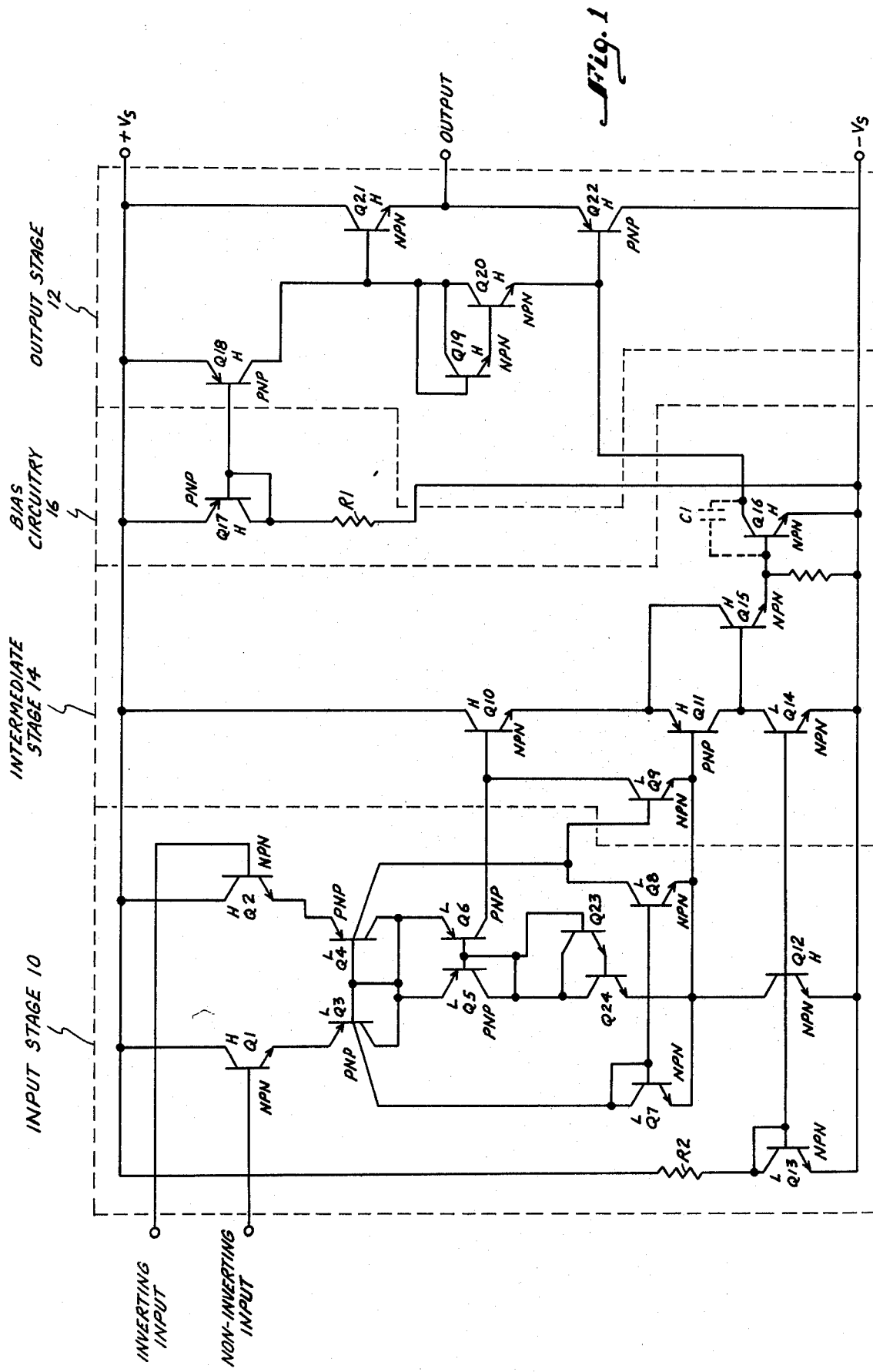

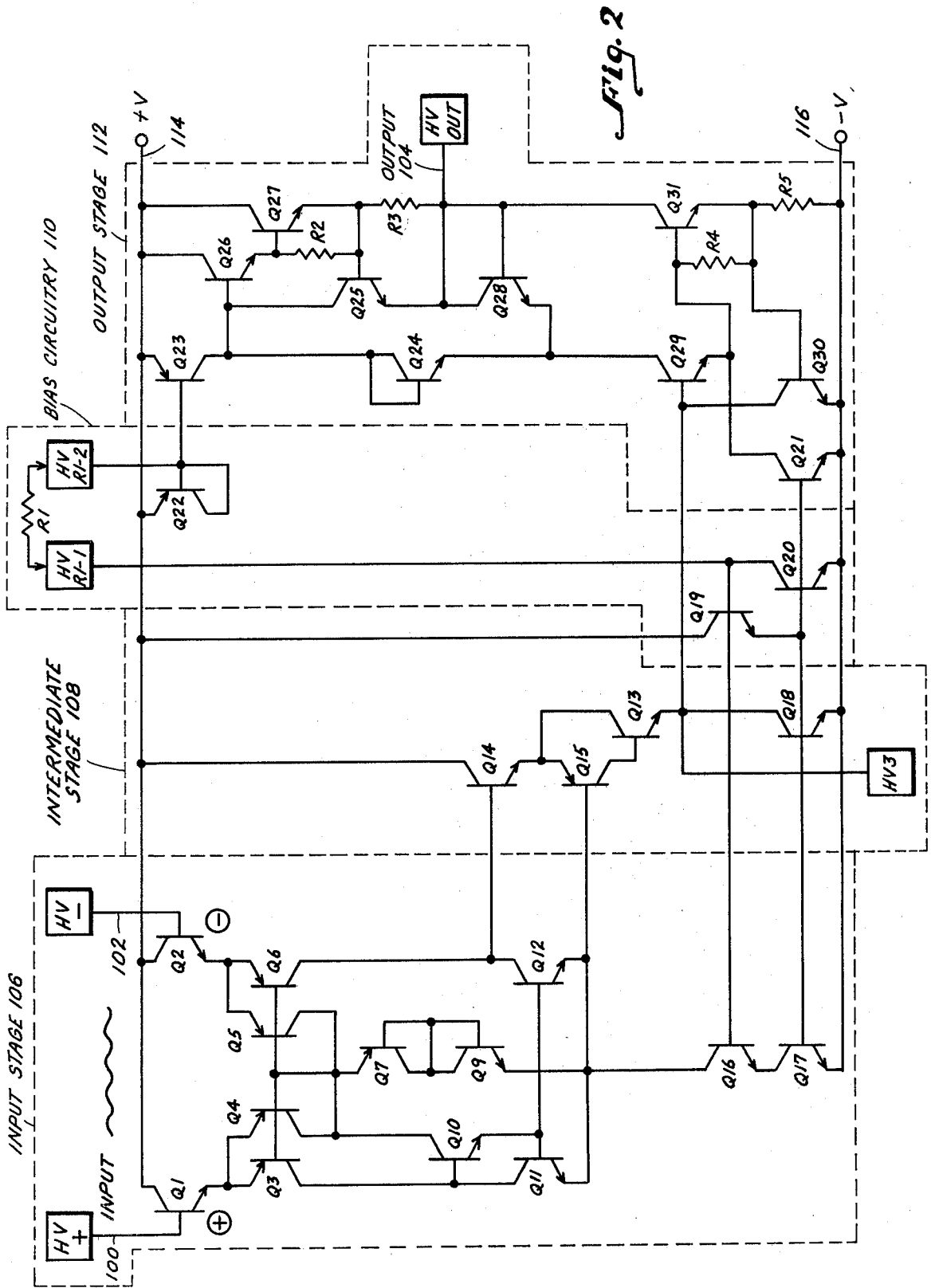

HIGH VOLTAGE OPERATIONAL AMPLIFIER

This application is a continuation-in-part of application Ser. No. 295,433 filed Aug. 24, 1981, now abandoned.

BACKGROUND OF THE INVENTION

1. Field of the Invention

The present invention relates to operational amplifiers generally and more particularly to a high voltage integrated circuit operational amplifier.

2. Description of the Prior Art

In high voltage integrated circuit amplifiers, the components have to be constructed to withstand the voltage across the device and, therefore, will be quite large to allow for depletion layer spreading. This is even more severe in the case of lateral PNP transistors, where the large base width results in low current gain of the transistor and high substrate injection along with the degraded frequency response.

Various operational amplifiers of the prior art are known, however, without the capability of withstanding a high voltage input on an integrated circuit VLSI chip. By way of background, U.S. Pat. Nos. 3,660,773; 4,135,162 and 4,232,273 are illustrative of known operational amplifiers and power amplifiers. Additionally with respect to U.S. Pat. No. 4,135,162, a known current mirror circuit is described. IBM Technical Disclosure Bulletin, Vol. 20, No. 2, July, 1977, in an article by R. C. Jaeger entitled "High Performance Differential Amplifier Input Stage" also describes a known current mirror configuration.

SUMMARY OF THE INVENTION

An object of the present invention is to provide a high voltage operational amplifier that reduces the voltage across at least the transistors in the input stage to levels not too detrimental to the devices.

Another object of the present invention is to provide an improved operational amplifier manufacturable on an integrated circuit chip which is capable of handling input voltages up to and in excess of 200 volts peak to peak ac and having an output voltage capability of from 0 volts to over 200 volts peac to peak ac.

A feature of the present invention is the provision of a high voltage integrated circuit operational amplifier comprising: an input circuit having an inverting input and a non-inverting input; and an output circuit coupled to the input circuit and having an output for the amplifier; the input circuit including a first pair of transistors having a high voltage characteristic of one conductivity type each coupled to a different one of the inputs and one terminal of a power supply, a second pair of transistors having a low voltage characteristic of opposite conductivity type each coupled to a different one of the first pair of transistors and to each other, and a third pair of transistors having a low voltage characteristic of the one conductivity type each coupled to a different one of the second pair of transistors, to each other and to the other terminal of the power supply.

BRIEF DESCRIPTION OF THE DRAWINGS

The above-mentioned and other objects and features of the present invention and the manner of obtaining them will become more apparent by reference to the following description taken in conjunction with the drawings, wherein:

FIG. 1 is a circuit diagram of a high voltage operational amplifier in accordance with the principles of the present invention;

FIG. 2 is a circuit diagram illustrative of an additional embodiment of the operational amplifier of applicant's invention.

DESCRIPTION OF THE PREFERRED EMBODIMENTS

The operational amplifier illustrated by FIG. 1 includes an input stage 10 having an inverting input and a non-inverting input for coupling an input signal of, for example, up to 200 V peak to peak ac to the operational amplifier; an output stage 12 having an output for coupling out the signal of up to 200 V peak to peak ac, for example; an intermediate stage 14 and bias circuitry shown generally at 16.

Input stage 10 includes high voltage NPN transistor Q1 having its base connected to the non-inverting input and a high voltage NPN transistor Q2 having its base connected to the inverting input. Each of transistors Q1 and Q2 are connected to the positive terminal of a power supply. Connected to transistors Q1 and Q2 are low voltage PNP transistors Q3 and Q4. Transistors Q3 and Q4 are lateral PNP transistors each having two collectors. One of the collectors of transistors Q3 and Q4 is coupled to an associated one of the NPN transistors Q7 and Q8 which are low voltage transistors with these two transistors being connected to the high voltage NPN transistor Q12 connected to the negative terminal of the power supply. Transistors Q1, Q2, Q3 and Q4 taken together constitute a differential amplifier for amplifying the input signal on the basis of Q1 and Q2.

Transistors Q7 and Q8 in conjunction with that part of transistors Q3 and Q4 associated with their collector coupled thereto acts as a bias circuit for the input circuit 1 while the other portion of transistors Q3 and Q4 associated with their other collector together with the associated portion of the intermediate stage 14 acts as level shifters for the input signals. Transistors Q7 and Q8 can be considered to be in a "current mirror" configuration.

Low voltage PNP transistors Q5 and Q6 comprise a current mirror to provide the active load for transistor Q9, and are coupled by a transistor connected to provide a zener diode function to the emitters of transistors Q7 and Q8. This will maintain proper biasing for transistors Q3 through Q11. The bias current provided by Q12 will be split four ways. The paths are: (1) portion of Q3, Q7; (2) the diode connected portion of Q3, Q5 and the two transistors Q23 and Q24 acting as a zener diode; (3) the diode connected portion of Q4, Q6 and Q9; and (4) portion of Q4 and Q8. High voltage NPN transistor Q10, low voltage NPN transistors Q9, low voltage NPN transistor Q14, and high voltage NPN transistors Q15 and Q16 constitute the intermediate state 14. Q11 and Q15 form what is called a composite PNP of sufficiently high beta, such that the base current of Q11 can be neglected as compared to the bias current for the input circuit. Q14 is built with a small emitter so that its collector current is only a small fraction of the current provided by Q12.

Transistors Q7 and Q8 constitute a current mirror together with transistors Q3 and Q4 to provide a double-to-single ended conversion (a symmetric signal is converted to an asymmetric signal), while also amplifying the signal The purpose of this conversion is to provide an asymmetric output, i.e. a voltage level referenced to ground from a symmetric input, i.e. from signals referenced to each other and floating with respect to ground.

Transistor Q9 is a common emitter amplifier for providing additional gain for the signal at point X for driving the base of transistor Q10. Transistor Q10 is an emitter follower which provides impedance transformation from the collector of Q9 to the emitter of Q11. Q11 provides level shifting, and together with Q15 forms a composite PNP transistor for shifting the dc level of the signal coupled thereto.

The output stage 12 includes high voltage PNP transistor Q18, high voltage NPN transistors Q19 and Q20 together with high voltage NPN transistor Q21 connected as shown to a high voltage vertical PNP transistor Q22 to provide at the junction of transistors Q21 and Q22 the asymmetric output signal for the operational amplifier.

Bias stage 16 for the output stage 12 is provided by resistor R1 and high voltage PNP transistor Q17, while bias circuitry is provided by resistor R2 and low voltage NPN transistor Q13. The Darlington connected transistors Q19 and Q20 assure proper biasing for Q21 and Q22 such that class B operation is achieved. Also, Q14 provides bias for Q11.

As can be seen, many of the transistors operate at low voltage. This is particularly important for transistors Q3 and Q4, where the base width is reduced to about 10 microns regardless of the voltages the amplifier has to work with. This will afford superior high frequency performance for transistors Q3 and Q4, thereby increasing the gain bandwidth product of the amplifier. Transistor Q11 is the only lateral high voltage PNP transistor in the signal path, thereby providing the lowest pole in the transfer function of the amplifier. This feature can be used to compensate the amplifier for low to medium loop gain. Unity gain compensation may be accomplished by connecting a capacitor C1, shown in dotted outline, between the base and collector of transistor Q16. The input common mode range of the operational amplifier includes the positive voltage +Vs of the power supply and is four volts above the negative voltage −Vs of the power supply. Transistor 16 provides gain for signals at the output of Q15 so that sufficient drive is provided for the output stage 12. Transistors Q17 and Q18 constitute a current mirror such that Q18 provides an active load for Q16. Since Darlington connected transistors Q19 and Q20 maintain class B operation as aforementioned, no current flows when no signal is present, a constant voltage is maintained between the bases of Q21 and Q22. Transistors Q21 and Q22 are emitter followers providing current gain to drive the output load. The bias networks are shown using resistors. However, in an actual circuit the bias network will be provided differently taking into consideration the variations in Vs. The construction of the operational amplifier of the present invention can be very useful for handling voltages in excess of 200 volts, where the size of the transistors are determined almost entirely by the depletion layer spreading.

Referring now to FIG. 2, another embodiment of the operational amplifier is illustrated. Operationally, the embodiment shown by FIG. 2 functions similarly to that of FIG. 1; however, it is configured to be more efficiently manufacturable on an integrated circuit chip. The square terminals illustrate bonding pads on a chip which, in the example shown, uses bipolar technology.

A symmetric input voltage signal of from 0 to 200 volts ac (peak-to-peak) for example, may be coupled to input terminals 100 and 102. An asymmetric output signal, also between 0 to 200 volts ac (peak-to-peak) is obtained at the output terminal 104 of the amplifier.

The input stage 106 of the amplifier includes transistors Q1 through Q12. Transistors Q1 and Q2, which have the input signal coupled to the bases thereof, are high voltage emitter followers which are configured to drive the common base low voltage PNP transistors Q3 and Q6.

Transistors Q4 and Q5, which ae PNP transistors, are emitter coupled to Q1 and Q2 and form current mirrors for proper biasing of the circuit with Q3 and Q6, respectively. Low voltage transistors Q10, Q11 and Q12 constitute an improved current mirror which, together with PNP transistors Q3 and Q6, function as a double to single ended converter to convert the symmetric input signal to an asymmetric signal.

Bias current for the input stage 106 is provided by NPN transistors Q16 and Q17, which are cascade connected to minimize bias mismatch caused by non-zero oiutput conductance of the transistors Q16 and Q17.

Intermediate stage 108 includes transistors Q13, Q14, Q15 and Q18. Intermediate stage 108 functions to level shift the signal generated at the collector of Q12, which is coupled to the base of Q15 and drives the base of Q29 via transistor Q13. Transistor Q14 is an emitter follower which performs impedance matching between the collector of Q12 and the emitter of Q15. Transistors Q15 and Q13 taken together comprise a composite PNP transistor with a good beta characteristic. Transistor Q18 provides bias current for transistors Q13, Q14 and Q15.

Transistors Q19, Q20 and Q22 and resistor R1 form bias circuitry 110 and are configured in conventional manner to provide proper voltage and current biasing for the output stage 112. Appropriate bias voltages are applied at 114 and 116.

The output stage includes transistors Q23 through Q31, and function similarly to the output stage described with reference to FIG. 1. Power transistors Q27 and Q31, are chosen to be capable of handling 100 milliamps as are resistors R2 through R5. Resistor R3, together with transistor Q24 provides an overcurrent protection circuit for power transistor Q27. Resistor R5 and transistor Q30 provides an overcurrent protection circuit for power transistor Q31.

While I have described above the principles of my invention in connection with specific apparatus, it is to be clearly understood that this description is made only by way of example and not as a limitation to the scope of my invention as set forth in the objects thereof and in the accompanying claims.

I claim:

1. A high voltage integrated circuit operational amplifier comprising:
   an input circuit having an inverting input and a noninverting input for a high voltage input signal; and an output circuit coupled
   to said input circuit and having an output for said amplifier; said input circuit including
   a first pair of transistors having a high voltage characteristic of one conductivity type for providing an impedance transformation from a high impedance to a low impedance, each coupled to a different one of said inputs and to the positive terminal of a power supply,
   a second pair of transistors having a low voltage characteristic of opposite conductivity type for biasing the input stage for providing amplification of the input signal, each coupled to a different one of said first pair of transistors and to each other, and a third pair of transistors having a low voltage characteristic of said one conductivity type for providing gain, each coupled to a different one of said second pair of transistors, to each other and to a current source, such that a double-to-single-ended conversion is accomplished.

2. An amplifier according to claim 1, further including an intermediate circuit coupled between said input circuit and said output circuit, said intermediate circuit including:

transistor means for providing an impedance transformation from a high impedance to a low impedance, and;

a pair of transistors for providing level shifting from the input voltage level to a voltage level close to the voltage level of the negative power supply.

3. An amplifier according to claim 2 wherein said output circuit includes:

amplification means coupled to the output of said level shifting transistor pair for providing amplification of its input when the output of said amplification means is sourcing current, and for providing current gain when the output of said amplification means is sinking current; and means for providing a high current gain when the output of said means is sourcing current; and means for providing an additional current gain, in combination with said amplification means when the output of said means for providing additional amplification is sinking current.

4. A high voltage integrated circuit operational amplifier comprising:

an input stage for receiving a symmetric high voltage ac input signal, said input stage including differential amplifier means having said input signal coupled thereto;

means comprised of low voltage transistors for providing a double-to-single-ended conversion of said symmetric input signal to an asymmetric signal; and means for level shifting the dc level of said asymmetric signal; and an output stage having said level shifted asymmetric signal coupled thereto, said output stage including:

amplifier means for providing class B amplification of said asymmetric signal; and drive means having said amplified asymmetric signal coupled thereto for providing current gain to a load whereby an asymmetric high voltage output signal is coupled to said load.

* * * * *